(12) United States Patent
Nakamura et al.

(10) Patent No.: US 11,492,823 B2
(45) Date of Patent: Nov. 8, 2022

(54) DOOR HANDLE

(71) Applicant: ALPS ALPINE CO., LTD., Tokyo (JP)

(72) Inventors: Toshiki Nakamura, Miyagi (JP);
Takashi Sasaki, Miyagi (JP);
Yoshiyuki Kikuchi, Miyagi (JP);
Yuzuru Kawana, Miyagi (JP);
Yukimitsu Yamada, Miyagi (JP);
Daisuke Takai, Miyagi (JP); Heishiro Fudo, Niigata (JP)

(73) Assignee: ALPS ALPINE CO., LTD., Tokyo (JP)

( * ) Notice: Subject to any disclaimer, the term of this patent is extended or adjusted under 35 U.S.C. 154(b) by 146 days.

(21) Appl. No.: 17/005,740

(22) Filed: Aug. 28, 2020

(65) Prior Publication Data
US 2020/0392769 A1   Dec. 17, 2020

Related U.S. Application Data

(63) Continuation of application No. PCT/JP2019/003713, filed on Feb. 1, 2019.

(30) Foreign Application Priority Data

Mar. 23, 2018   (JP) .............................. JP2018-056212

(51) Int. Cl.
*B60J 5/00* (2006.01)
*E05B 81/76* (2014.01)
*E05B 85/16* (2014.01)

(52) U.S. Cl.
CPC ................. *E05B 81/76* (2013.01); *B60J 5/00* (2013.01); *E05B 85/16* (2013.01); *E05Y 2900/50* (2013.01)

(58) Field of Classification Search
CPC .......... E05B 81/76; E05B 85/16; E05B 81/77; B60J 5/00; E05Y 2900/50; H03K 17/9622;
(Continued)

(56) References Cited

U.S. PATENT DOCUMENTS 8,403,384 B2 * 3/2013 Ieda ...................... B60R 25/246
292/336.3
8,408,610 B2   4/2013 Ieda et al.
(Continued)

FOREIGN PATENT DOCUMENTS

JP   2006-344554   12/2006
JP   2009-030360    2/2009
(Continued)

OTHER PUBLICATIONS

International Search Report for PCT/JP2019/003713 dated Mar. 26, 2019.
(Continued)

*Primary Examiner* — Kristina R Fulton
*Assistant Examiner* — Thomas L Neubauer
(74) *Attorney, Agent, or Firm* — IPUSA, PLLC

(57) ABSTRACT

A door handle includes door handle case, a first detection electrode and a second detection electrode disposed in the door handle case, and a controller connected to the first detection electrode and the second detection electrode. The controller separately measures a first capacitance between the first detection electrode and an operation body and a second capacitance between the second detection electrode and the operation body, and the controller determines whether a locking operation is performed by the operation body based on one or both of the first capacitance and the second capacitance.

9 Claims, 14 Drawing Sheets

(58) Field of Classification Search
CPC .......... H03K 2217/96073; H03K 2217/96078; H03K 17/955; G07C 2209/65
See application file for complete search history.

(56) References Cited

U.S. PATENT DOCUMENTS

| | | | |
|---|---|---|---|
| 2008/0252303 A1 | 10/2008 | Kato et al. | |
| 2012/0019014 A1* | 1/2012 | Tateishi | E05B 85/16 |
| | | | 292/336.3 |
| 2014/0327454 A1 | 11/2014 | Menard et al. | |
| 2016/0138307 A1* | 5/2016 | Pohl | E05B 81/76 |
| | | | 292/336.3 |
| 2017/0235008 A1 | 8/2017 | Guibbert et al. | |
| 2019/0267993 A1* | 8/2019 | Sawada | G01V 3/088 |

FOREIGN PATENT DOCUMENTS

| | | |
|---|---|---|
| JP | 2010-024797 | 2/2010 |
| JP | 2012-129762 | 7/2012 |
| JP | 2013-113626 | 6/2013 |
| JP | 2015-048672 | 3/2015 |
| JP | 2016-023490 | 2/2016 |

OTHER PUBLICATIONS

Extended European Search Report dated Nov. 24, 2021 issued with respect to the corresponding European Patent Application No. 19771434.8.

* cited by examiner

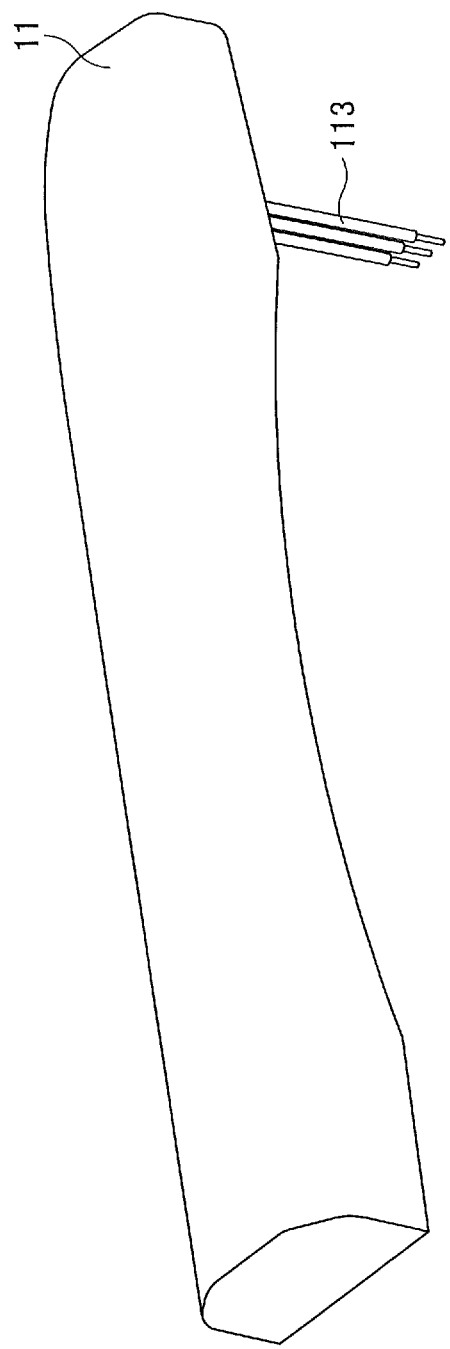
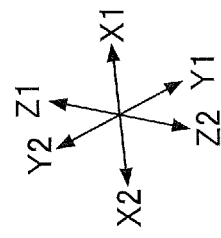
FIG.1 PRIOR ART

FIG.6
PRIOR ART
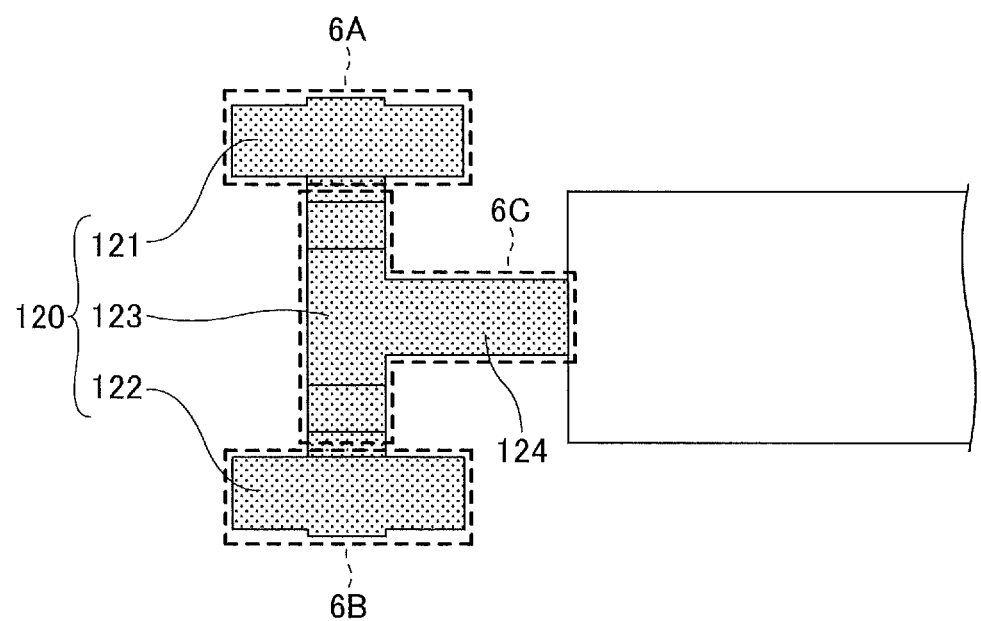
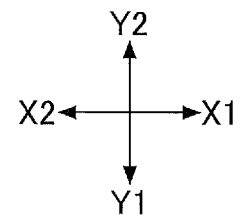

FIG.9
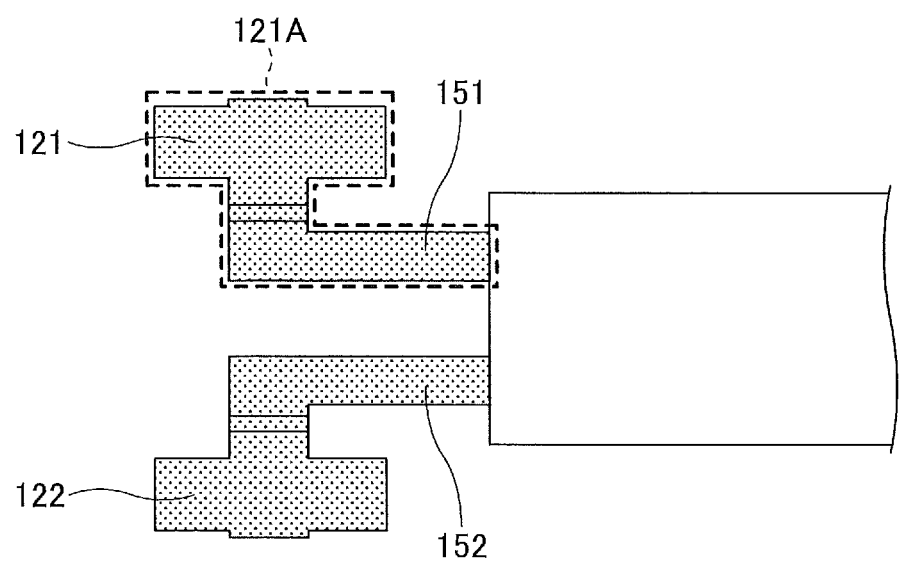
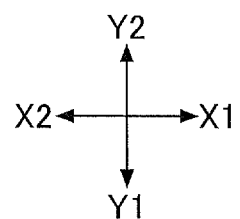

FIG.10
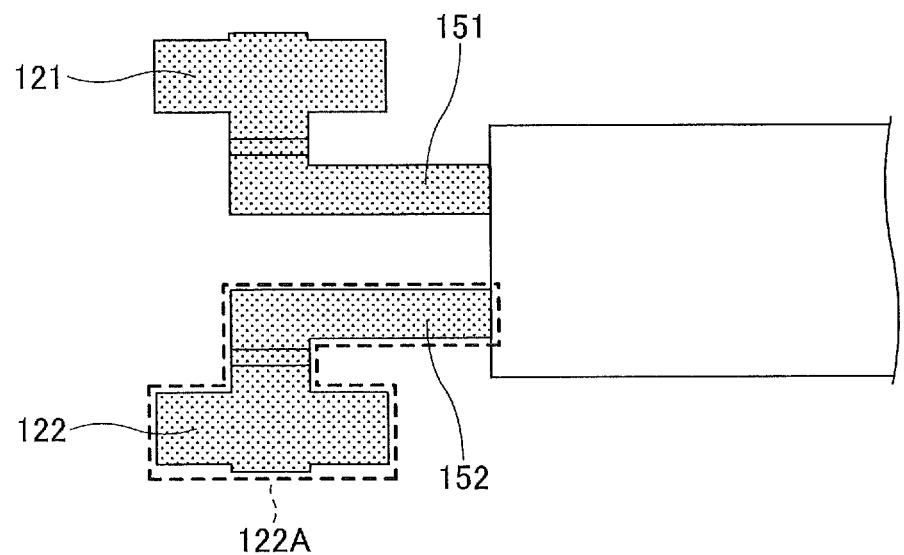
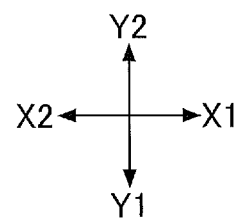

DOOR HANDLE

CROSS-REFERENCE TO RELATED APPLICATIONS

This application is a continuation of International Application No. PCT/JP2019/003713, filed on Feb. 1, 2019 and designating the U.S., which claims priority to Japanese Patent Application No. 2018-056212 filed on Mar. 23, 2018. The contents of these applications are incorporated herein by reference in their entirety.

BACKGROUND OF THE INVENTION

1. Field of the Invention

The disclosures herein relate to a door handle.

2. Description of the Related Art

The doors of a vehicle are provided with door handles for opening or closing the doors. In recent years, door handles that allow a user to lock or unlock a door by moving the hand near the door handle. With such door handles, an electrostatic sensor or the like that detects an operation by the user's hand is provided.

A door lock electrostatic sensor is provided within a door handle case. When the user's finger approaches the door handle and is detected by the door lock electrostatic sensor, the door locks. However, because the door lock electrostatic sensor is located within the door handle case, the position of the door lock electrostatic sensor is unable to be correctly identified from the outside, and the door may remain locked even when the user's finger approaches wiring connected to the door lock electrostatic sensor. For example, in a case where the user brings the finger near a door unlock electrostatic sensor in order to unlock the door, a door locking operation may be falsely detected if the user's finger approaches the wiring connected to the door lock electrostatic sensor.

RELATED-ART DOCUMENTS

Patent Documents

[Patent Document 1] Japanese Laid-Open Patent Publication No. 2010-24797
[Patent Document 2] Japanese Laid-Open Patent Publication No. 2009-30360

SUMMARY OF THE INVENTION

It is desirable to provide a door handle that detects a locking operation only when a user wishes to lock a door by reducing false detection of an operation not intended by a user, such that a locking operation is not falsely detected when the user wishes to unlock the door.

According to an aspect of an embodiment, a door handle includes door handle case, a first detection electrode and a second detection electrode disposed in the door handle case, and a controller connected to the first detection electrode and the second detection electrode. The controller separately measures a first capacitance between the first detection electrode and an operation body and a second capacitance between the second detection electrode and the operation body, and the controller determines whether an operation is performed by the operation body based on one of the first capacitance and the second capacitance.

BRIEF DESCRIPTION OF THE DRAWINGS

Other objects and further features of the present invention will be apparent from the following detailed description when read in conjunction with the accompanying drawings, in which:

FIG. 1 is a perspective view of the external appearance of a door handle;
FIG. 6 is a diagram illustrating a lock detection electrode of the door handle;
FIG. 9 is a diagram (1) illustrating the interior of the door handle according to the first embodiment;
FIG. 10 is a diagram (2) illustrating the interior of the door handle according to the first embodiment.

DESCRIPTION OF THE EMBODIMENTS

Figure 2:
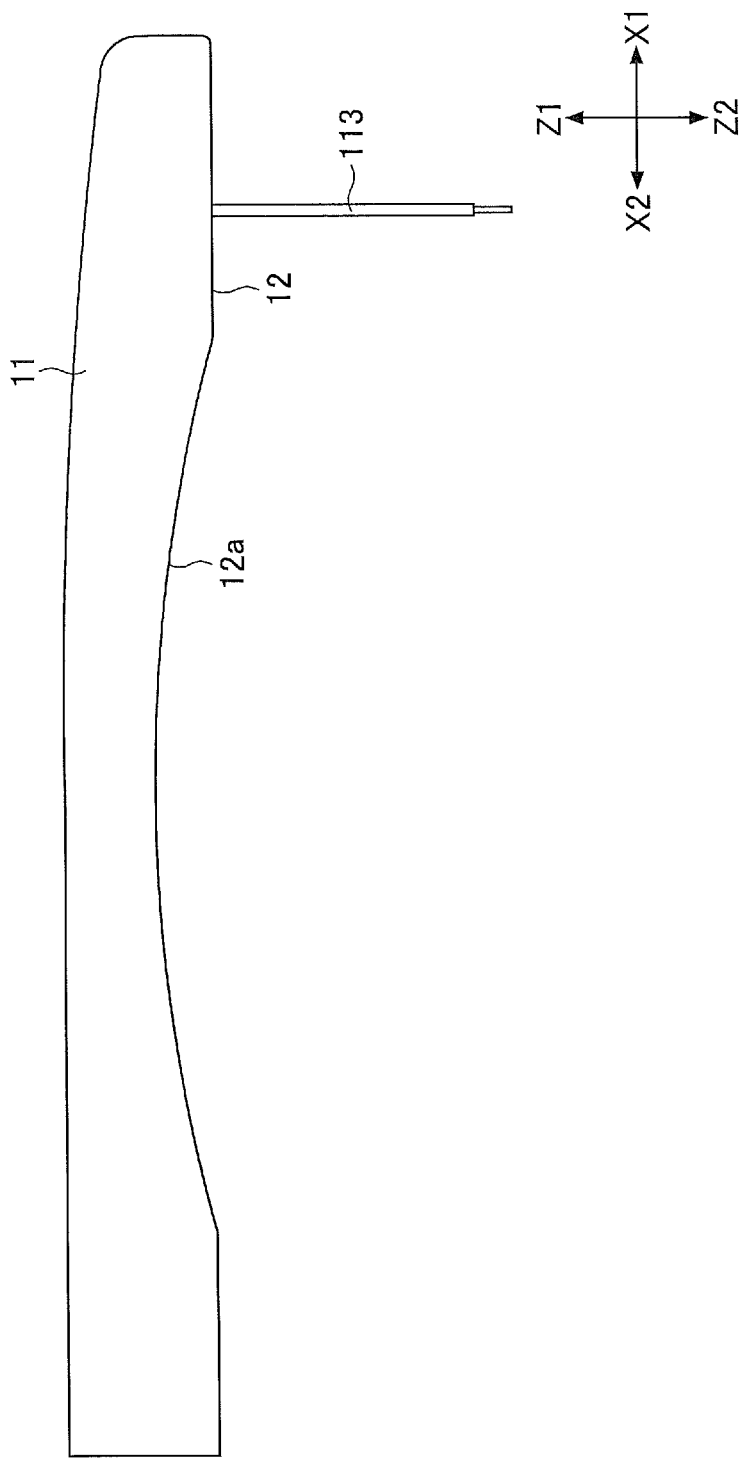
FIG. 2 is an overhead view of the exterior of the door handle.

According to an embodiment, it is possible provide a door handle that detects a locking operation only when a user wishes to lock a door by reducing false detection of an operation not intended by a user, such that the locking operation is not falsely detected when the user wishes to unlock the door.

In the following, embodiments will be described. The same members are denoted by the same reference numerals, and a description thereof will not be repeated. Further, in the present application, an X1-X2 direction, a Y1-Y2 direction, and a Z1-Z2 direction are mutually perpendicular directions. Further, a plane including the X1-X2 direction and the Y1-Y2 direction is referred to as a XY-plane, a plane including the Y1-Y2 direction and the Z1-Z2 direction is referred to as a YZ-plane, and a plane including the Z1-Z2 direction and the X1-X2 direction is referred to as a ZX-plane.

First Embodiment

Figure 3:
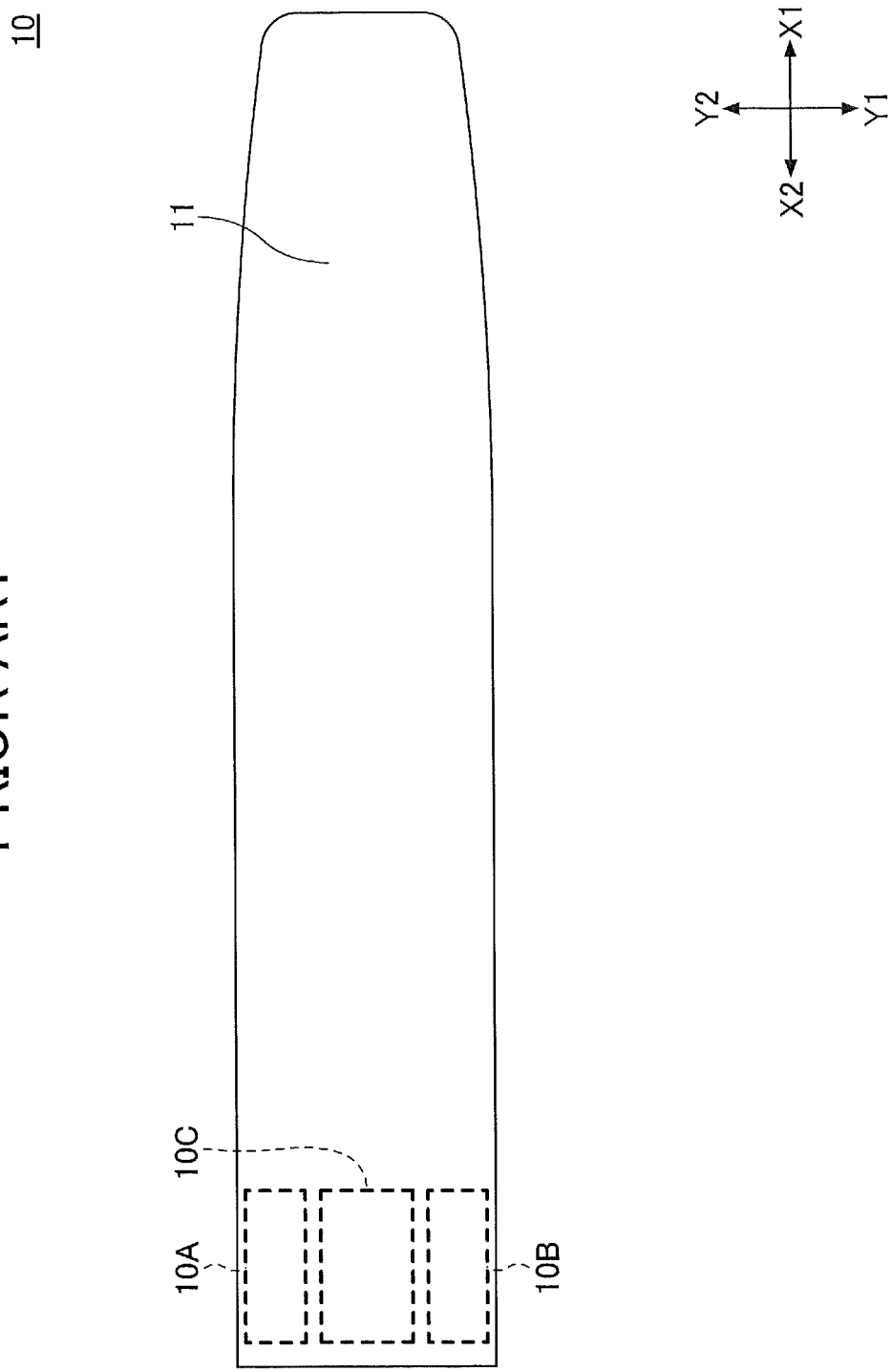
FIG. 3 is a front view of the exterior of the door handle.
Figure 4:
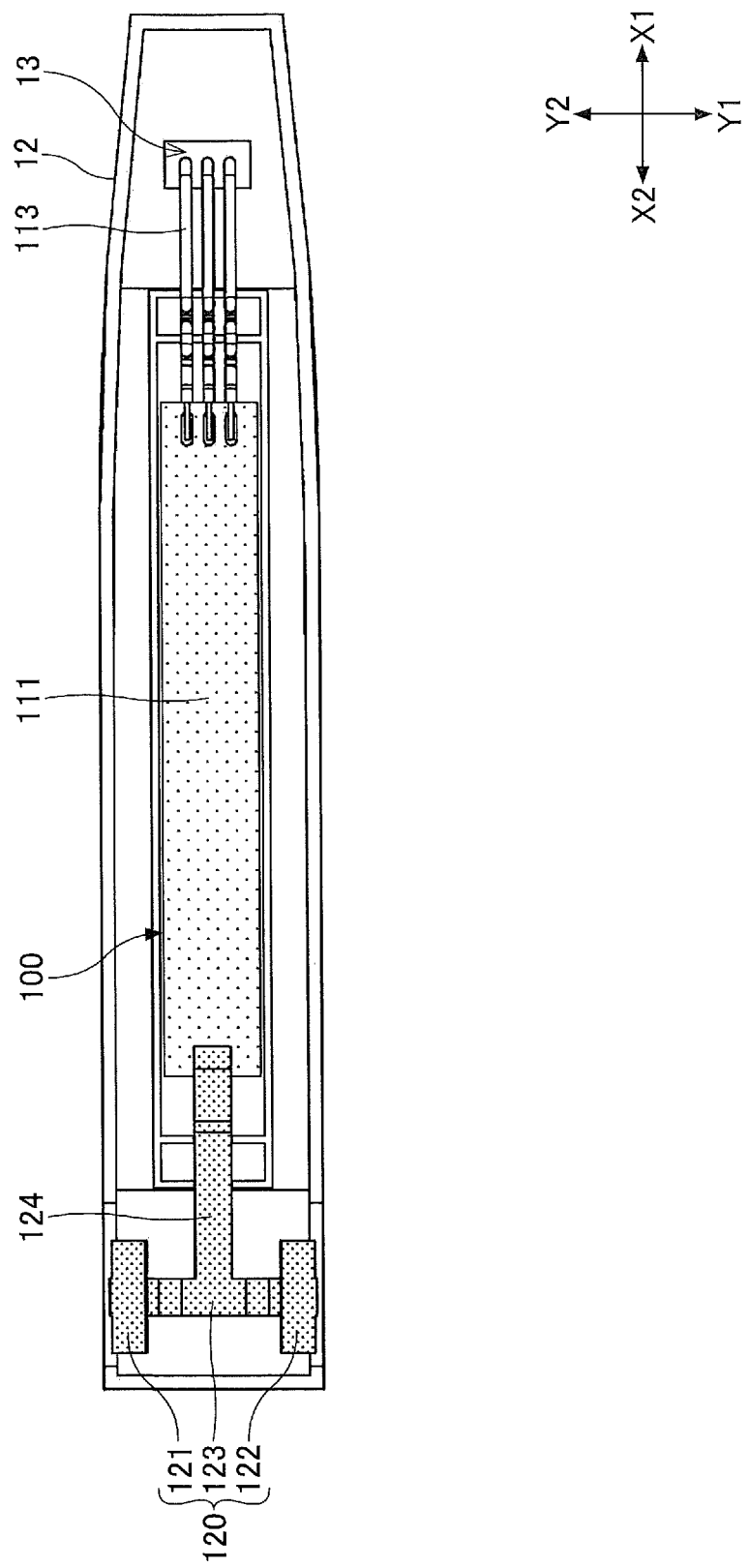
FIG. 4 is a front view of the interior of the door handle.
Figure 5:
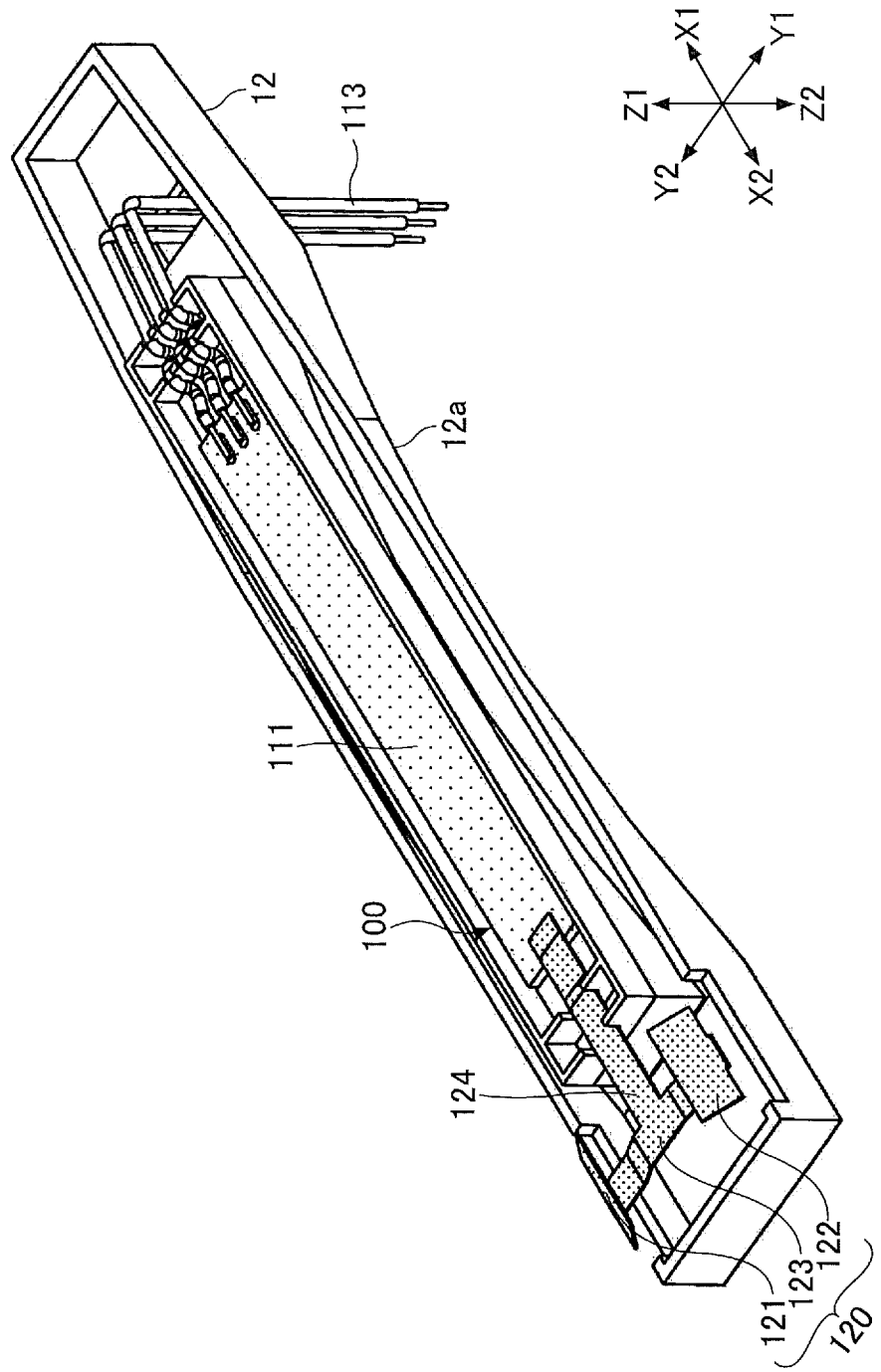
FIG. 5 is a perspective view of the interior of the door handle.

A door handle 10 will be described with reference to FIG. 1 through FIG. 4. FIG. 1 is a perspective view of the door handle 10, FIG. 2 is an overhead view of the door handle 10, FIG. 3 is a front view of the door handle 10, FIG. 4 is a front view of the door handle 10 in which a first door handle case 11 is not depicted, and FIG. 5 is a perspective view of the door handle 10 in which the first door handle case 11 is not depicted.

The door handle 10 is attached to the exterior side of a door of a vehicle such as an automobile. A door handle case, which is a housing of the door handle 10, is configured by the first door handle case 11 and a second door handle case 12. The first door handle case 11 and the second door handle case 12 cover an electrostatic sensor 100, and the electrostatic sensor 100 is provided within the door handle 10. Further, the middle portion of an inner surface 12a of the second door handle case 12 is recessed toward the Z1 side such the door handle 10 can be readily grasped by hand. Further, a through-hole 13 is provided through the second door handle case 12 in order to pass wiring 113 and the like connected to the electrostatic sensor 100. The wiring 113 is provided for electrically connecting the electrostatic sensor 100 to the exterior of the door handle 10.

In the electrostatic sensor 100, an electrode for an unlock electrostatic sensor, namely an unlock detection electrode (not illustrated) is disposed on the surface of or within a flat substrate 111 formed of an insulator. The substrate 111 of the electrostatic sensor 100 has an approximately rectangular shape. When the longitudinal direction of the door handle 10 is the X1-X2 direction, the longitudinal direction of the substrate 111 of the electrostatic sensor 100 within the door handle 10 is also the X1-X2 direction. The surface of the substrate 111 of the electrostatic sensor 100 is approximately parallel to the XY-plane. In the electrostatic sensor 100, an unlocking operation performed by a user's finger can be detected based on a change in capacitance between the unlock detection electrode and the user's finger.

Further, an electrode for a lock electrostatic sensor, namely a lock detection electrode 120 is provided on the X2 side of the substrate 111. The lock detection electrode 120 includes an upper-side lock detection electrode 121 and a lower-side lock detection electrode 122. The upper-side lock detection electrode 121 is provided on the Y2 side that is the upper side, and the upper-side lock detection electrode 121 is provided on the Y1 side that is the lower side. The upper-side lock detection electrode 121 is connected to the lower-side lock detection electrode 122 via a connection electrode 123, and the connection electrode 123 is connected to the substrate 111 via a wiring electrode 124. In the present specification, the upper-side lock detection electrode 121 may be referred to as a first lock detection electrode, and the lower-side lock detection electrode 122 may be referred to as a second lock detection electrode.

In the door handle 10 with the above configuration, as illustrated in FIG. 3, when the user's finger approaches an upper-side detection region 10A, which is located on the Y2 side and at the end on the X2 side of the door handle 10 or a lower-side detection region 10B, which is located on the Y1 side and at the end on the X2 side of the door handle 10, the capacitance between the user's finger and the upper-side lock detection electrode 121 or the lower-side lock detection electrode 122 changes. Then, when the capacitance exceeds a predetermined value, a door locking operation is detected.

Further, when unlocking the door, the user moves the hand near the unlock detection electrode. In this manner, the capacitance between the unlock detection electrode and the user's finger changes, and the door is unlocked when the capacitance exceeds a predetermined value. Specifically, the unlock detection electrode is provided on the surface of or within the substrate 111, and the capacitance between the unlock detection electrode and the user's finger changes when the user's finger touches the inner surface 12a of the second door handle case 12. Then, when the capacitance exceeds a predetermined value, a door unlocking operation is detected.

For example, when the user moves the hand near the inner surface 12a of the second door handle case 12 in order to unlock the door, there may be a case where the user's hand may also approach an intermediate region 10C located between the upper-side detection region 10A and the lower-side detection region 10B. In the intermediate region 10C, the connection electrode 123 and the wiring electrode 124 are disposed. Therefore, if the user's finger approaches the intermediate region 10C, the capacitance between the user's finger and the connection electrode 123 or the wiring electrode 124 may change. Then, if the capacitance exceeds the predetermined value, a locking operation would be falsely detected.

That is, in the door handle 10 illustrated in FIG. 3, when the user's finger approaches the upper-side detection region 10A, which is located on the Y1 side and also at the end on the X2 side of the door handle 10, or the lower-side detection region 10B, which is located on the Y1 side and also at the end on the X2 side of the door handle 10, the user's finger approaches a detection region 6A of the upper-side lock detection electrode 121 or a detection region 6B of the lower-side lock detection electrode 122 of the lock detection electrode 120 within the door handle case, as illustrated in FIG. 6. When the capacitance detected at the lock detection electrode 120 exceeds the predetermined value, a door locking operation is detected. In addition, in the door handle 10 illustrated in FIG. 3, when the user's finger approaches the intermediate region 10C located between the upper-side detection region 10A and the lower-side detection region 10B, the user's finger approaches a detection region 6C of both the connection electrode 123 and the wiring electrode 124, of the lock detection electrode 120 within the door handle case, as illustrated in FIG. 6. Then, if the capacitance detected at the lock detection electrode 120 exceeds the predetermined value, a door locking operation would be falsely detected.

In view of the above, it is desirable to provide a door handle that detects a locking operation only when the user's finger approaches the vicinity of the upper-side lock detection electrode 121 or the lower-side lock detection electrode 122 of the door handle, without falsely detecting the locking operation when the user's finger approaches the vicinity of the intermediate region 10C.

(Door Handle)

Figure 7:
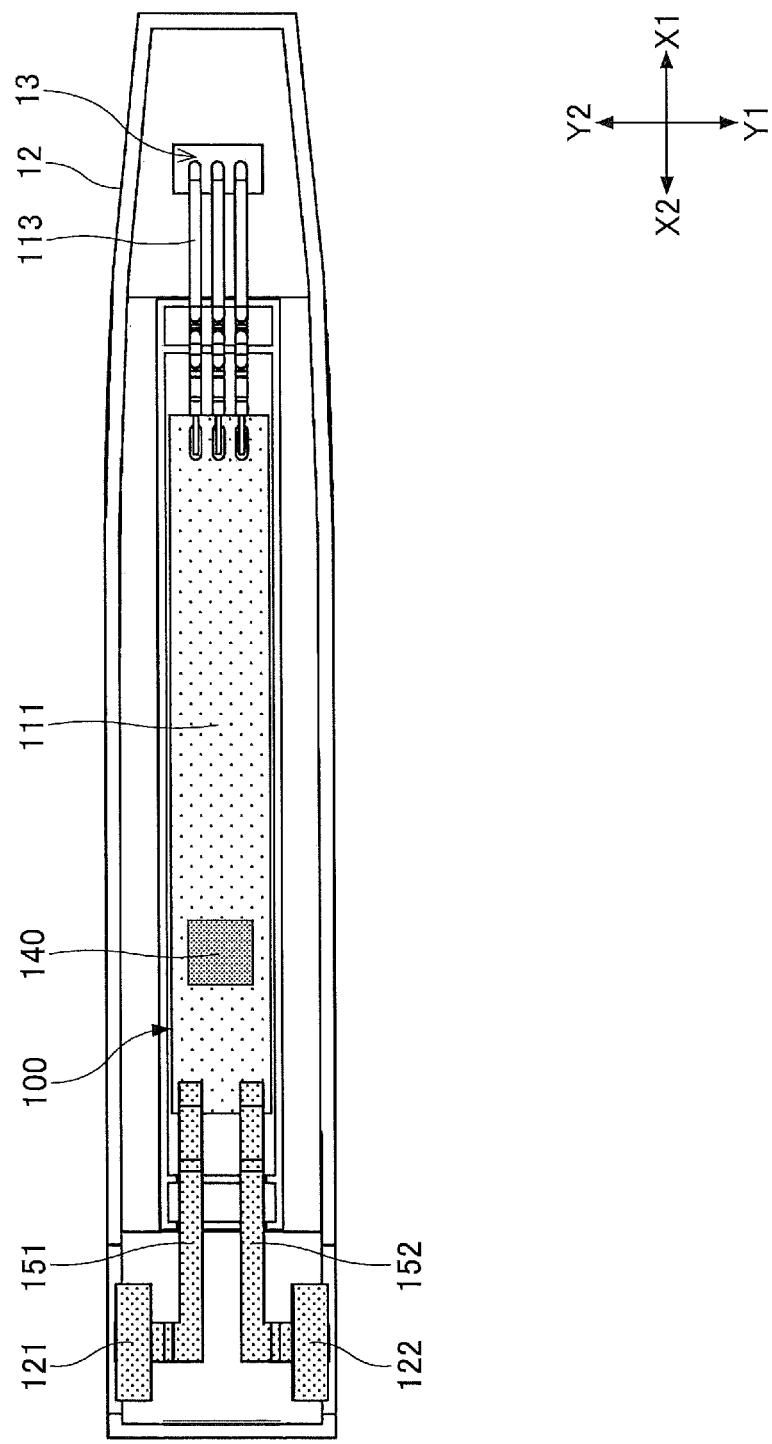
FIG. 7 is a front view of the interior of a door handle according to a first embodiment.
Figure 8:
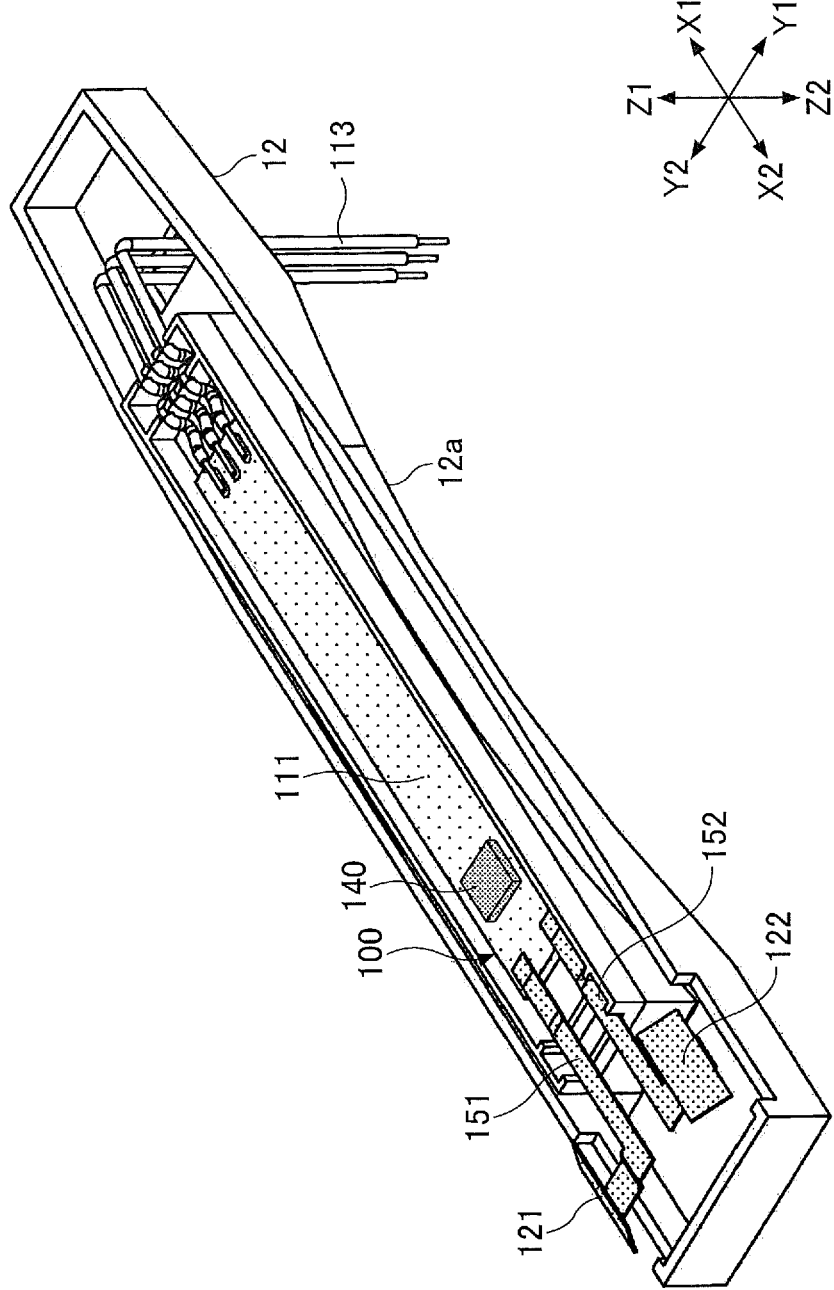
FIG. 8 is a perspective view of the interior of the door handle according to the first embodiment.

Next, a door handle according to a first embodiment will be described with reference to FIG. 7 and FIG. 8. The exterior of the door handle according to the first embodiment is the same as that of the door handle illustrated in FIG. 1 through FIG. 3, and is attached to the exterior of a door of a vehicle such as an automobile. FIG. 7 is a front view of the door handle according to the first embodiment and FIG. 8 is a front view of the door handle according to the first embodiment, in which the first door handle case 11 is not depicted.

In the door handle according to the first embodiment, the upper-side lock detection electrode 121 provided within the door handle case is connected to the substrate 111 via an upper-side wiring electrode 151, and the lower-side lock detection electrode 122 is connected to the substrate 111 via a lower-side wiring electrode 152. In the door handle according to the first embodiment, there is no connection electrode 123 that connects the upper-side lock detection electrode 121 to the lower-side lock detection electrode 122. Accordingly, even if the user's finger approaches the vicinity of a region corresponding to the intermediate region 10C of the door handle illustrated in FIG. 3, there is only a small change in capacitance. Further, the upper-side wiring electrode 151 and the lower-side wiring electrode 152 are separately connected to a controller 140 disposed on the substrate 111. Therefore, capacitances can be individually detected.

Specifically, while the capacitance is measured at the upper-side lock detection electrode 121 via the upper-side wiring electrode 151 as controlled by the controller 140, the capacitance is not measured at the lower-side lock detection electrode 122. In this case, as illustrated in FIG. 9, a region surrounded by a dashed line represents a detection region 121A of the upper-side lock detection electrode 121. Further, while the capacitance is measured at the lower-side lock detection electrode 122 via the lower-side wiring electrode 152 as controlled by the controller 140, the capacitance is not measured at the upper-side lock detection electrode 121. In this case, as illustrated in FIG. 10, a region surrounded by a dashed line represents a detection region 122A of the lower-side lock detection electrode 122.

In the door handle having the structure illustrated in FIG. 4 through FIG. 6, if the user's finger approaches the intermediate region 10C illustrated in FIG. 3, the capacitance at the connection electrode 123 would change. However, in the door handle according to the first embodiment, the upper-side lock detection electrode 121 and the lower-side lock detection electrode 122 are separately connected to the substrate 111 via the respective upper-side wiring electrode 151 and the lower-side wiring electrode 152. In addition, a space is formed in a region corresponding to the connection electrode 123, and the upper-side wiring electrode 151 and the lower-side wiring electrode 152 are thus separated from each other. Therefore, the value of the capacitance obtained from the upper-side lock detection electrode 121 via the upper-side wiring electrode 151 and the value of the capacitance detected obtained from the lower-side lock detection electrode 122 via the lower-side wiring electrode 152 are not summed and are separated. Therefore, in the first embodiment, even when the user's finger approaches the vicinity of the region corresponding to the intermediate region 10C, a change in capacitance at the upper-side wiring electrode 151 or the lower-side wiring electrode 152 is less than half that of the door handle having the structure illustrated in FIG. 4 through FIG. 6. Accordingly, the door handle according to the first embodiment is less sensitive to changes in capacitance caused by the user's finger approaching the region corresponding to the intermediate region 100, thereby reducing false detection.

Figure 11:
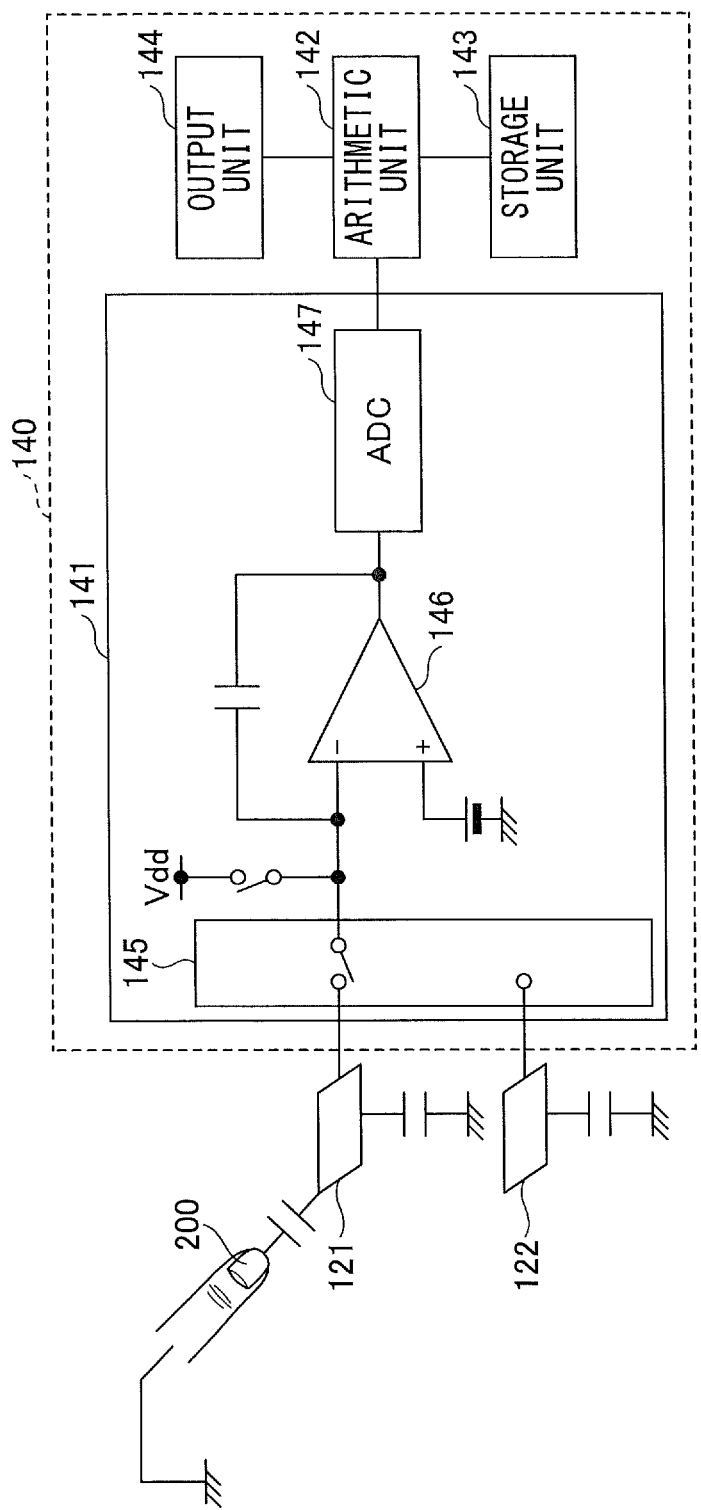
FIG. 11 is a diagram illustrating a controller of the door handle according to the first embodiment.

In the first embodiment, as illustrated in FIG. 11, the controller 140 includes a capacitance measuring unit 141, an arithmetic unit 142, a storage unit 143, and an output unit 144. The capacitance measuring unit 141 includes a switch 145, an amplifier 146, and an analog-to-digital converter (ADC) 147. The switch 145 is connected to the upper-side lock detection electrode 121 and the lower-side lock detection electrode 122. By closing the switch 145, a predetermined voltage Vdd can be applied to the upper-side lock detection electrode 121 and the lower-side lock detection electrode 122. Accordingly, the potential of each of the upper-side lock detection electrode 121 and the lower-side lock detection electrode 122 can be detected. Then, the detected potential is amplified by the amplifier 146, and an analog signal is converted to a digital signal by the ADC 147. Based on the digital signal converted as described above, the arithmetic unit 142 can acquire a capacitance value between a finger 200 and the upper-side lock detection electrode 121, and a capacitance value between the finger 200 and the lower-side lock detection electrode 122. Based on these capacitance values, the arithmetic unit 142 performs calculation and comparison, and the output unit 144 outputs a lock signal. In the present specification, the finger 200 may be referred to as an operation body. Note that the upper-side lock detection electrode 121 the lower-side lock detection electrode 122 are the same size.

(Door Handle Locking Operation)

Figure 12:
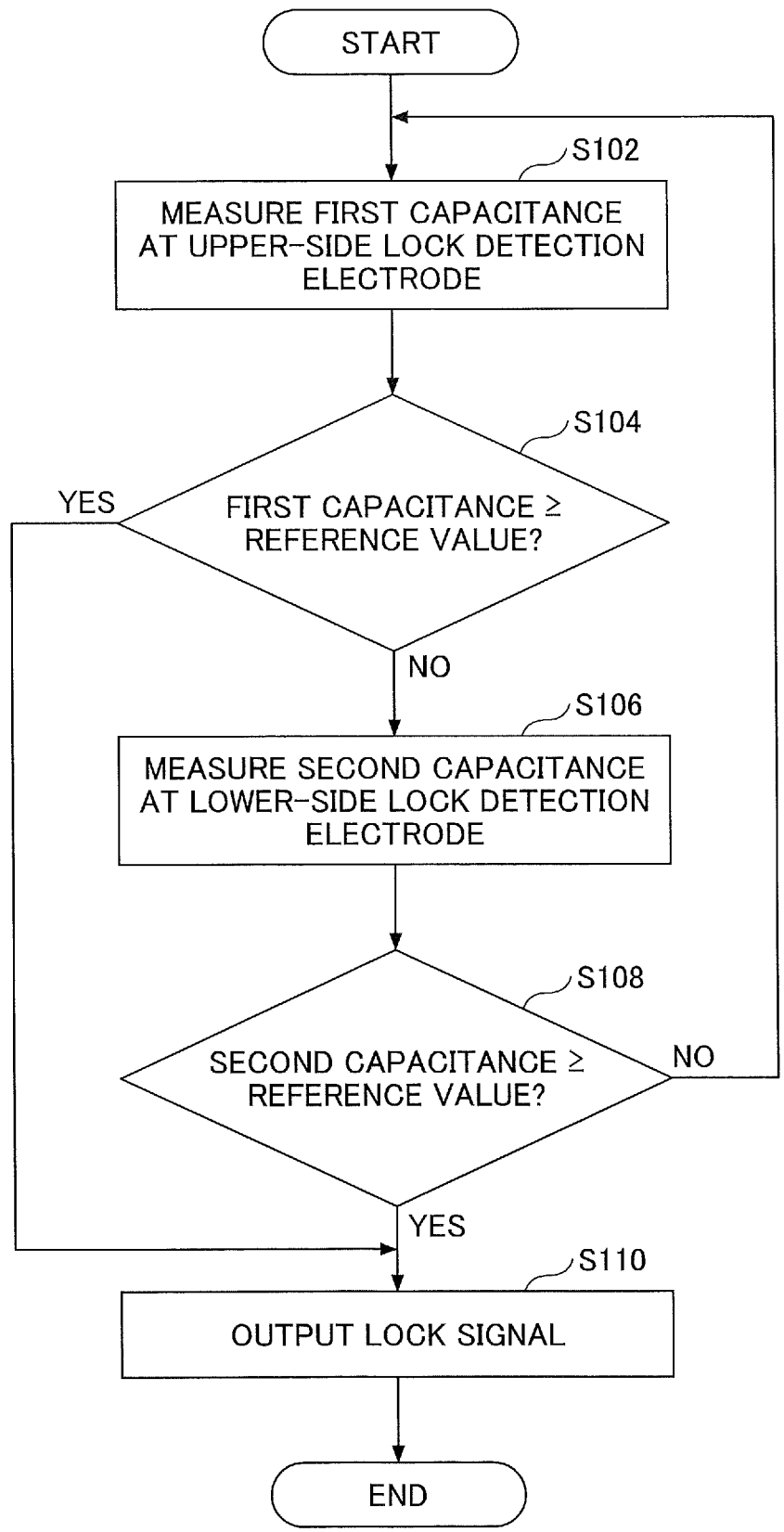
FIG. 12 is a flowchart of a door handle lock operation according to the first embodiment.

Next, a door handle locking operation according to the first embodiment will be described with reference to FIG. 12. The controller 140 controls the following operation.

First, in step 102 (S102), the capacitance measuring unit 141 measures the capacitance between the upper-side lock detection electrode 121 and the finger 200 by applying a predetermined voltage to the upper-side lock detection electrode 121 and measuring the voltage at the upper-side lock detection electrode 121. In the present specification, the capacitance between the upper-side lock detection electrode 121 and the finger 200 measured as described above may be referred to as a "first capacitance".

Next, in step 104 (S104), it is determined whether the first capacitance, that is, the capacitance between the upper-side lock detection electrode 121 and the finger 200 is greater than or equal to a predetermined reference value. The determination may be made by the arithmetic unit 142 or the like. The predetermined reference value is a reference value used to determine whether the finger 200 approaches the upper-side lock detection electrode 121 or the lower-side lock detection electrode 122 for a locking operation, and is preliminarily stored in the storage unit 143 or the like of the controller 140. If it is determined that the first capacitance is greater than or equal to the predetermined reference value, the process proceeds to step 110. If it is determined that the first capacitance is less than the predetermined reference value, the process proceeds to step 106.

Next, in step 106 (S106), the capacitance measuring unit 141 measures the capacitance between the lower-side lock detection electrode 122 and the finger 200 by applying the predetermined voltage to the lower-side lock detection electrode 122 and measuring the voltage at the lower-side lock detection electrode 122. In the present specification, the capacitance between the lower-side lock detection electrode 122 and the finger 200 measured as described above may be referred to as a "second capacitance".

Next, in step 108 (S108), it is determined whether the second capacitance, that is, the capacitance between the lower-side lock detection electrode 122 and the finger 200 is greater than or equal to the predetermined reference value. The determination may be made by the arithmetic unit 142 or the like. If it is determined that the second capacitance is greater than or equal to the predetermined reference value, the process proceeds to step 110. If it is determined that the second capacitance is less than the predetermined reference value, the process returns to step 102 and the capacitance measuring unit 141 measures capacitance again.

Next, in step 110 (S110), the output unit 144 outputs a lock signal for locking a door. Accordingly, the door locks.

In the door handle having the structure illustrated in FIG. 3 through FIG. 5, if the user's finger approaches the intermediate region 100 between the upper-side lock detection electrode 121 and the lower-side lock detection electrode 122 of the lock detection electrode 120, a lock signal would be output. However, in the first embodiment, no connection electrode 123 that connects the upper-side lock detection electrode 121 to the lower-side lock detection electrode 122 is provided, and the capacitance at the upper-side lock detection electrode 121 and the capacitance at the lower-side lock detection electrode 122 are measured separately. Therefore, even when the user's finger approaches the region between the upper-side lock detection electrode 121 and the lower-side lock detection electrode 122 of the lock detection electrode 120, a lock signal is not output. Thus, for an operation not intended to lock the door, it is possible to prevent the operation from being falsely detected as a locking operation.

Second Embodiment

Figure 13:
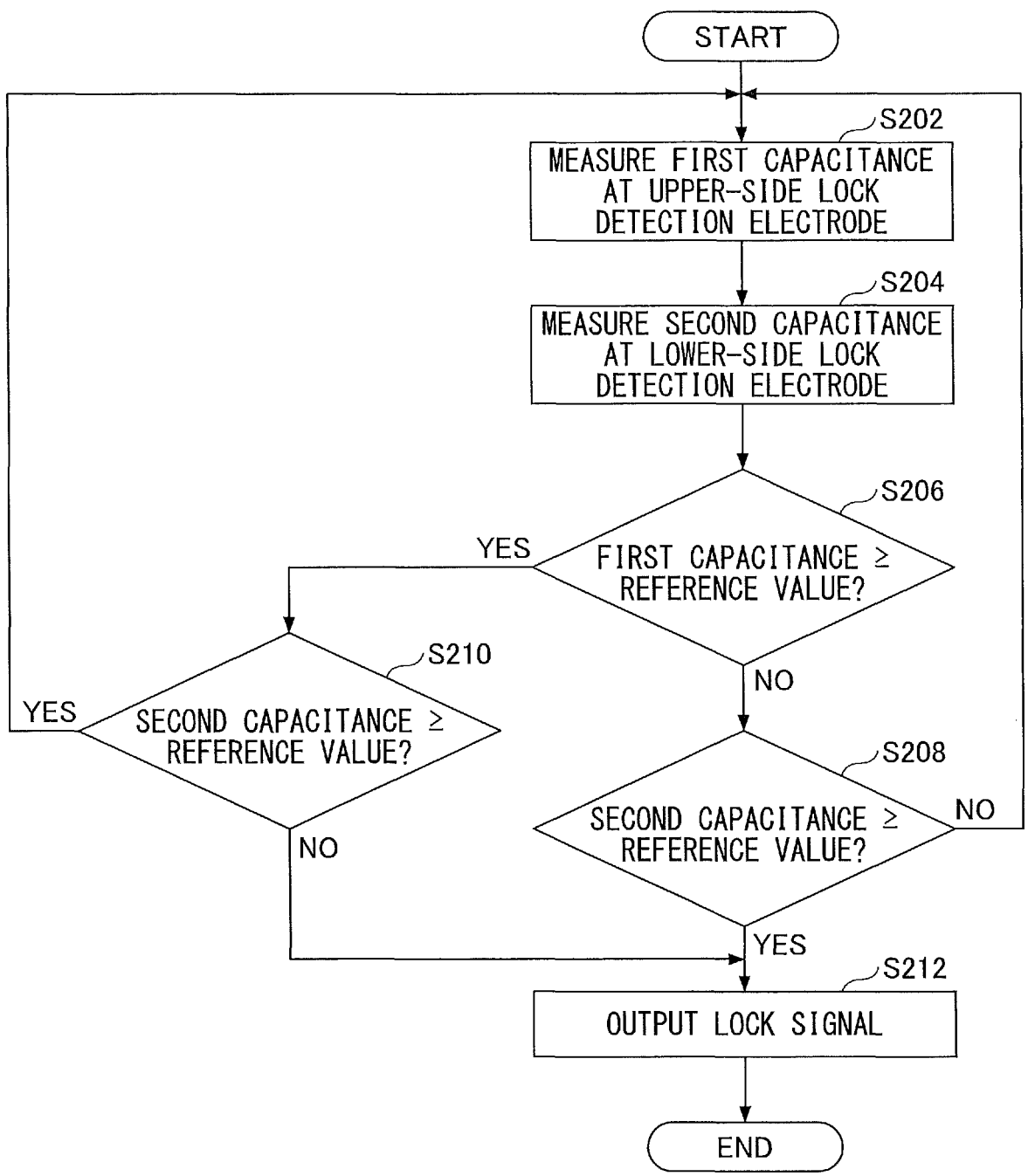
FIG. 13 is a flowchart of a door handle locking operation according to a second embodiment.

Next, a door handle locking operation according to a second embodiment will be described with reference to FIG. 13. In the second embodiment, when one of the first capacitance measured at the upper-side lock detection electrode 121 and the second capacitance measured at the lower-side lock detection electrode 122 is greater than or equal to the predetermined reference value, it is determined that a locking operation is performed by the user. Conversely, if both the first capacitance and the second capacitance are less than the predetermined reference value or when both the first capacitance and the second capacitance are greater than or equal to the predetermined reference value, it is determined that a locking operation is not performed by the user. If both the first capacitance and the second capacitance are less than the predetermined reference value, it is determined that there is no locking operation by the user. If both the first capacitance and the second capacitance are greater than or equal to the predetermined reference value, it is determined that the user's finger is located between the upper-side lock detection electrode 121 and the lower-side lock detection electrode, that is, a locking operation is not intended by the user. Note that the controller 140 controls the following operation.

First, in step 202 (S202), the capacitance measuring unit 141 measures the first capacitance between the upper-side lock detection electrode 121 and the finger 200 by applying a predetermined voltage to the upper-side lock detection electrode 121 and measuring the voltage at the upper-side lock detection electrode 121.

Next, in step 204 (S204), the capacitance measuring unit 141 measures the second capacitance between the lower-side lock detection electrode 122 and the finger 200, by applying the predetermined voltage to the lower-side lock detection electrode 122 and measuring the voltage at the lower-side lock detection electrode 122.

Next, in step 206 (S206), it is determined whether the first capacitance, that is the capacitance between the upper-side lock detection electrode 121 and the finger 200 is greater than or equal to the predetermined reference value. The determination may be made by the arithmetic unit 142 or the like. If it is determined that the first capacitance is greater than or equal to the predetermined reference value, the process proceeds to step 210. If it is determined that the first capacitance is less than the predetermined reference value, the process proceeds to step 208.

Next, in step 208 (S208), it is determined whether the second capacitance, that is, the capacitance between the lower-side lock detection electrode 122 and the finger 200 is greater than or equal to the predetermined reference value. The determination may be made by the arithmetic unit 142 or the like. If it is determined that the second capacitance is greater than or equal to the predetermined reference value, the process proceeds to step 212. If it is determined that the second capacitance is less than the predetermined reference value, the process returns to step 202 and the capacitance measuring unit 141 measures capacitance again.

Similarly, in 210 (S210), it is determined whether the second capacitance, that is, the capacitance between the lower-side lock detection electrode 122 and the finger 200 is greater than or equal to the predetermined reference value. If it is determined that the second capacitance is greater than or equal to the predetermined reference value, the process returns to step 202 and the capacitance measuring unit 141 measures capacitance again. If it is determined that the second capacitance is less than the predetermined reference value, the process proceeds to step 212.

Next, in 212 (S212), the output unit 144 outputs a lock signal for locking a door. Accordingly, the door locks.

Note that the contents other than those described above are similar to those of the first embodiment.

Third Embodiment

Figure 14:
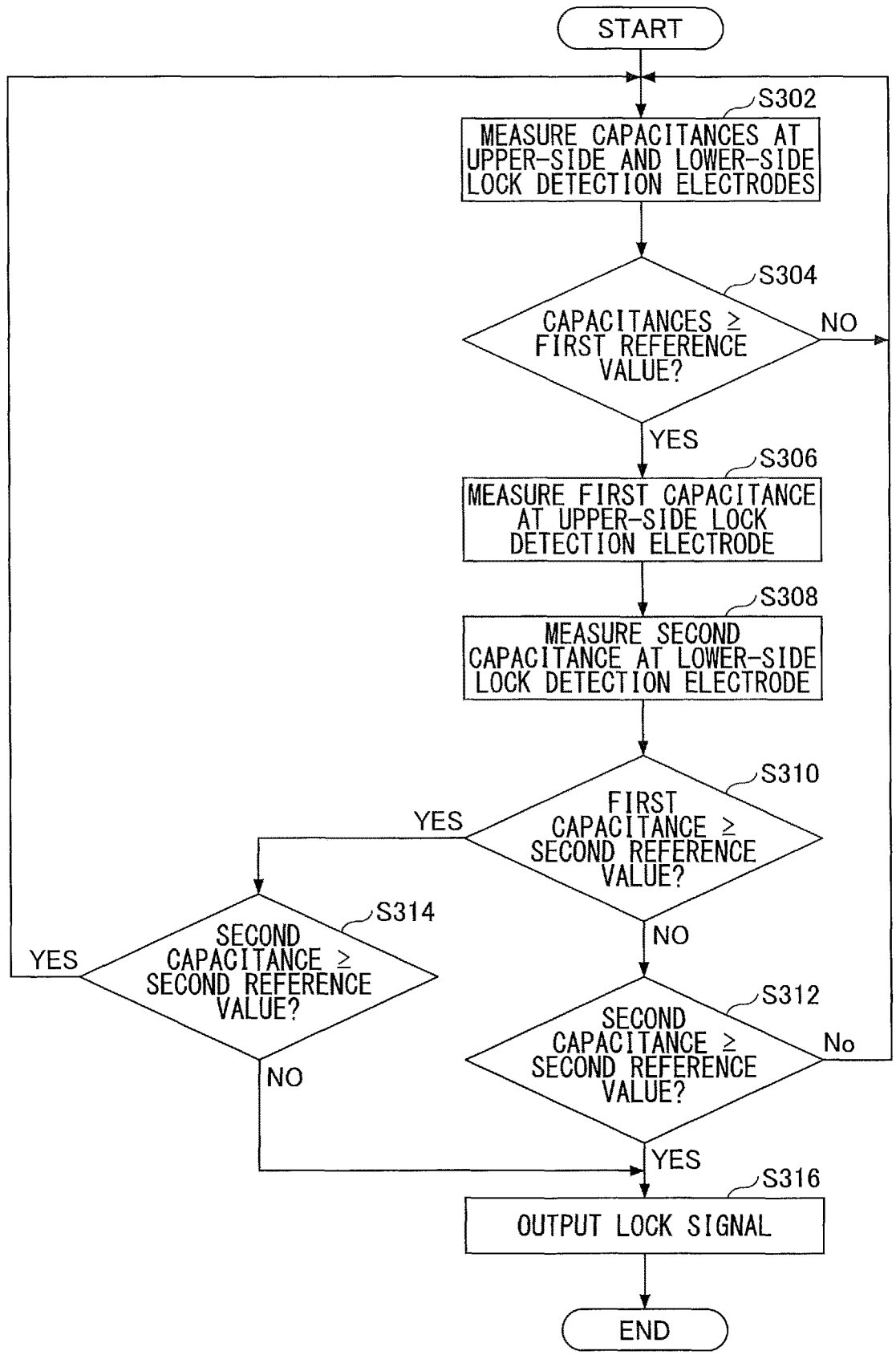
FIG. 14 is a flowchart of a door handle locking operation according to a third embodiment.

Next, a door handle locking operation according to a third embodiment will be described with reference to FIG. 14. In the third embodiment, the total capacitance at both of the upper-side lock detection electrode 121 and the lower-side lock detection electrode 122 is measured. If the total capacitance is greater than or equal to a predetermined reference value (a first reference value), the first capacitance at the upper-side lock detection electrode 121 and the second capacitance at the lower-side lock detection electrode 122 are separately measured, similar to the second embodiment.

First, in step 302 (S302), the capacitance measuring unit 141 measures the capacitance (a third capacitance) between the upper-side lock detection electrode 121 and the lower-side lock detection electrode 122 versus the finger 200, by applying a predetermined voltage to the upper-side lock detection electrode 121 and the lower-side lock detection electrode 122 and measuring the voltage at the upper-side lock detection electrode 121 and the lower-side lock detection electrode 122.

Next, in step 304 (S304), it is determined whether the capacitance measured in step S302, that is, the capacitance between the upper-side lock detection electrode 121 and the lower-side lock detection electrode 122 versus the finger 200 is greater than or equal to the first reference value. The determination may be made by the arithmetic unit 142 or the like. If it is determined that the capacitance measured in step 302 is greater than or equal to the first reference value, the process proceeds to step 306. If it is determined that the capacitance measured in step 302 is less that the first reference value, the process returns to step 302 and the capacitance measuring unit 141 measures capacitance again.

Next, in step 306 (S306), the capacitance measuring unit 141 measures the first capacitance between the upper-side lock detection electrode 121 and the finger 200, by applying the predetermined voltage to the upper-side lock detection electrode 121 and measuring the voltage at the upper-side lock detection electrode 121.

Next, in step 308 (S308), the capacitance measuring unit 141 measures the second capacitance between the lower-side lock detection electrode 122 and the finger 200, by applying the predetermined voltage to the lower-side lock detection electrode 122 and measuring the voltage at the lower-side lock detection electrode 122.

Next, in step 310 (S310), it is determined whether the first capacitance, that is the capacitance between the upper-side lock detection electrode 121 and the finger 200 is greater than or equal to a predetermined reference value (second reference value). The determination may be made by the arithmetic unit 142 or the like. If it is determined that the first capacitance is greater than or equal to the second reference value, the process proceeds to step 314. If it is determined that the first capacitance is less than the second reference value, the process proceeds to step 312.

Next, in step 312 (S312), it is determined whether the second capacitance, that is the capacitance between the lower-side lock detection electrode 122 and the finger 200 is greater than or equal to the second reference value. The determination may be made by the arithmetic unit 142 or the like. If it is determined that the second capacitance is greater than or equal to the second reference value, the process proceeds to step 316. If it is determined that the second capacitance is less than the second reference value, the process returns to step 302 and the capacitance measuring unit 141 measures capacitance again.

Similarly, in step 314 (S314), it is determined whether the second capacitance, that is the capacitance between the lower-side lock detection electrode 122 and the finger 200 is greater than or equal to the second reference value. If it is determined that the second capacitance is greater than or equal to the second reference value, the process returns to step 302 and the capacitance measuring unit 141 measures capacitance again. If it is determined that the second capacitance is less than the second reference value, the process proceeds to step 316.

Next, in step 316 (S316), the output unit 144 outputs a lock signal for locking a door. Accordingly, the door locks.

In the above-described manner, it is determined whether the total capacitance measured at both the upper-side lock detection electrode 121 and the lower-side lock detection electrode 122 is greater than or equal to the predetermined reference value. Only when it is determined that total capacitance is greater than or equal to the predetermined reference value, the capacitance at the upper-side lock detection electrode 121 and the capacitance at the lower-side lock detection electrode 122 are separately measured and compared to the reference value in the steps as of step S306. Accordingly, it is possible to reduce the number of times of capacitance is measured when the user's hand is not located in the vicinity of the lock detection electrodes or the door handle (when the total capacitance is less than the predetermined reference value), thus reducing power consumption.

The contents other those described above are similar to those of the second embodiment.

Although specific embodiments have been described above, the present disclosure is not limited to the above-described embodiments. Variations and modifications may be made to the described subject matter without departing from the scope of the invention as set forth in the accompanying claims.

What is claimed is:

1. A door handle comprising
a door handle case;
a first detection electrode and a second detection electrode disposed in the door handle case; and
a controller connected to the first detection electrode and the second detection electrode, wherein
the controller separately measures a first capacitance between the first detection electrode and an operation body and a second capacitance between the second detection electrode and the operation body, and
the controller determines whether an operation is performed by the operation body based on one or both of the first capacitance and the second capacitance, wherein the controller measures a total capacitance between the first detection electrode and the second detection electrode versus the operation body, and
when the total capacitance is greater than or equal to a predetermined reference value, the controller separately measures the first capacitance between the first detection electrode and the operation body and the second capacitance between the second detection electrode and the operation body.

2. The door handle according to claim 1, wherein the controller does not measure the second capacitance at the second detection electrode when measuring the first capacitance at the first detection electrode, and the controller does not measure the first capacitance at the first detection electrode when measuring the second capacitance at the second detection electrode.

3. The door handle according to claim 1, wherein the controller determines that the operation is performed by the operation body when one of the first capacitance and the second capacitance is greater than or equal to a predetermined reference value.

4. The door handle according to claim 3, wherein the controller determines that the operation is not performed by the operation body when both the first capacitance and the second capacitance are greater than or equal to the predetermined reference value.

5. The door handle according to claim 4, wherein the controller determines that the operation is not performed by the operation body when both the first capacitance and the second capacitance are less than the predetermined reference value.

6. The door handle according to claim 1, wherein the door handle is attached to a door of a vehicle,
the first detection electrode and the second detection electrode are lock detection electrodes, and
the operation performed by the operation body is an operation for locking the door.

7. The door handle according to claim 6, further comprising a substrate, an upper-side wiring electrode, and a lower-side wiring electrode that is disposed separately from the upper-side wiring electrode, wherein
the first detection electrode is disposed on an upper part of the door handle, and the second detection electrode is disposed on a lower part of the door handle, and
the first detection electrode is connected to the substrate via the upper-side wiring electrode, and the second detection electrode is connected to the substrate via the lower-side wiring electrode.

8. The door handle according to claim 6, wherein the controller determines that the operation is performed by the operation body when one of the first capacitance or the second capacitance is greater than or equal to a predetermined reference value, and the controller determines that the operation is not performed by the operation body when both the first capacitance and the second capacitance are greater than or equal to the predetermined reference value, or when both the first capacitance and the second capacitance are less than the predetermined reference value.

9. The door handle according to claim 1, wherein the controller determines a condition whether the total capacitance is greater than or equal to a predetermined reference value is met, and separately measure the first capacitance and the second capacitance only upon determining that the condition is met.

* * * * *